United States Patent [19]

Bending et al.

[11] Patent Number: 4,878,095
[45] Date of Patent: Oct. 31, 1989

[54] SEMICONDUCTOR DEVICE IN PARTICULAR A HOT ELECTRON TRANSISTOR

[75] Inventors: Simon J. Bending; Elmar Böckenhoff, both of Leonberg, Fed. Rep. of Germany

[73] Assignee: Wissenschaften e.V., Gottingen, Fed. Rep. of Germany

[21] Appl. No.: 118,504

[22] Filed: Nov. 9, 1987

[30] Foreign Application Priority Data

Jun. 11, 1987 [EP] European Pat. Off. ............ 87116451

[51] Int. Cl.$^4$ .............................................. H01L 29/80
[52] U.S. Cl. ......................................... 357/16; 357/34; 357/22
[58] Field of Search ...................... 357/16, 34 MB, 22

[56] References Cited

U.S. PATENT DOCUMENTS

4,691,215  9/1987  Luryi ..................................... 357/16

FOREIGN PATENT DOCUMENTS

| 084393 | 7/1983 | European Pat. Off. | 3/29 |
| 0141088 | 5/1985 | European Pat. Off. | 4/29 |
| 0183146 | 4/1986 | European Pat. Off. | 4/29 |
| 0214047 | 8/1986 | European Pat. Off. | 4/29 |
| 1210527 | 8/1986 | European Pat. Off. | 4/29 |
| 6139576 | 2/1986 | Japan | 357/34 MB |

OTHER PUBLICATIONS

Solid State Electronics, vol. 24, 1981, pp. 343–366, "Tunneling Hot Electron Transfer Amplifiers (Theta): Amplifiers Operating Up to the Infrared"; M. Heiblum.
Japanese Journal of Applied Physics, vol. 24, No. 11, Nov. 1985, part 2, Letters, pp. L853–L854, Tokyo, JP; "A New Functional Resonant-Tunneling Hot Electron Transistor (RHET)"; N. Yokoyama.
Applied Physics Letters, vol. 48, No. 1, Jan. 1987; pp. 71–73, American Institute of Physics, New York, U.S., "A High-Frequency Amplification and Generation in Charge Injection Devices"; A. Kastalsky et al.
Electronics Letters, vol. 21, No. 17, Aug. 15, 1985, pp. 757–758, Stevenage, Herts, GB; "MOCVD-grown AlGaAs/GaAs Hot Electron Transistor with a Base Width of 30 nm".
Applied Physics Letter 51(15), Oct. 12, 1987, "Selectively δ-Doped $Al_xGa_{1-x}As$/GaAs Heterostructure with High Two-Dimensional Electron—gas Concentrations . . ." E. F. Schubert.

*Primary Examiner*—Martin H. Edlow
*Assistant Examiner*—David Soltz
*Attorney, Agent, or Firm*—Townsend and Townsend

[57] ABSTRACT

In a semiconductor device having a plurality of semiconductor layers of different composition, such as a hot electron transistor, in which respective layers are contacted to form a majority carrier injection electrode, a control electrode and a majority carrier extraction electrode, the layers forming the electrodes are separated from one another by separating layers or layer systems of different composition. These separating layers form potential barriers for the majority carriers. A problem with such known devices is that the layer forming the control electrode has to have a low resistance which has previously required a high doping concentration in this layer. This doping concentration however increases losses due to plasmon/phonon coupling and scattering and reduces the switching speed of the device. This problem is now overcome by using an undoped layer for the control electrode and by asymmetrically doping an adjacent separating layer or layer system to form a two-dimensional electron or hole gas confined in a potential well at the interface between the control electrode and the doped separating layer or layer system. The control electrode contact is then made to the two-dimensional electron or hole gas which ensures adequately low resistance and high switching speeds.

31 Claims, 4 Drawing Sheets

WITHOUT BIAS VOLTAGE

FIG.1

FIG. 2 WITHOUT BIAS VOLTAGE

FIG. 3 WITH BIAS VOLTAGE

FIG. 5

SEMICONDUCTOR DEVICE IN PARTICULAR A HOT ELECTRON TRANSISTOR

The present invention relates to a semiconductor device such as a hot electron transistor, having a plurality of semiconductor layers of different composition some of which are contacted to form electrodes, with at least one of said layers acting as a control electrode, wherein the control electrode is separated from each of the other electrodes by a separating layer or layer system of different composition forming potential barriers for the majority carriers.

A discussion of such hot electron transistors is to be found in the article "Ballistic Electrons in Semiconductors" by Heiblum and Eastman in Scientific American February 1987, vol. 256, No. 2 from pages 64 to 73, the content of which is incorporated herein by way of reference.

Such a hot electron transistor is conveniently fabricated as a III-V or II-VI compositional semiconductor. One known hot electron transistor is fabricated in $GaAs/Al_xGa_{1-x}As$ and has the following basic layout:

(a) a GaAs substrate of approximately 100 $\mu$ thickness, (b) an n+GaAs layer of 0.1 $\mu$ thickness and with a doping concentration of $1\times10^{18}cm^{-3}$ grown on said substrate and contacted via said substrate to form a collector or electron extraction electrode, (c) a separator layer of $Al_xGa_{1-x}As$ with x typically lying in the range 0 to 0.4, usually 0.35 grown thereon with a layer thickness of 50 to 100 nm, with this layer being a graded compositional layer with x varying from 0.35 to 0 in the last 10 to 5 nm of the layer, (d) a layer of n+GaAs with a doping concentration of $1\times10^{18}cm^{-3}$ grown on the $Al_xGa_{1-x}As$ layer and having a thickness of 30 to 100 nm, with said n+GaAs layer being contacted to form a base or control electrode, (e) a further narror separator layer of $Al_xGa_{1-x}As$ with x typically lying in the range 0.3 to 0.35 grown on the layer forming said control electrode, with this $Al_xGa_{1-x}As$ layer being undoped, and (f) a layer of n+GaAs of approximately 0.5 $\mu$ thickness and a doping concentration of $1\times10^{18}$ grown on the narrow $Al_xGa_{1-x}As$ layer and contacted to form an emitter or electron injection electrode.

Such a hot electron transistor is a majority carrier device and in the example quoted the majority carriers are electrons. Equally majority carrier devices are conceivable in which the majority carriers are holes.

Such structures are conveniently grown by epitaxial techniques such as molecular beam epitaxy.

It is a problem with the known structures to obtain low base or control electrode resistances which are necssary for fast switching times. To achieve low base resistances one has to use high doping concentrations and this leads to plasmon-phonon coupling and reduced gain and to ionised impurity scattering which also reduces gain. Fast switching times in the known devices are considered to be of the order of $10^{-9}$ sec.

It is the object of the present invention to provide semiconductor switching structures which have faster switching times and higher gain.

In order to satisfy this object the present invention provides a semiconductor device of the initially named kind which is characterised in that the layer acting as said control electrode is substantially undoped; in that one of the separating layer or layer systems adjacent the control electrode is doped to generate majority charge carriers which form a two-dimensional electron or hole gas confined in a potential well at the interface between the control electrode and the doped separating layer or layer system; and in that the contact to the control electrode is a contact to the two-dimensional electron or hole gas.

Since the control electrode is essentially undoped (apart from unavoidable impurities) relatively little scattering occurs and this results in a high gain and a high speed of operation. Adequately low resistance is ensured by the trapped two-dimensional electron or hole gas (2DEG) which is contacted by contact to the control electrode. Moreover, it is particularly beneficial that the electrons (holes) of the 2DEG are located directly at the interface between the control electrode and the doped separating layer or layer system.

A preferred embodiment is characterised in that the contact to the control electrode is a low resistance ohmic contact. This is a convenient way of contacting the control electrode and the low resistance of the ohmic contact leads to a further improvement in the switching speed.

The layer forming the control electrode typically has a thickness in the range 10 nm to 100 nm. This wide range, which is not possible with conventional hot electron transistors, allows the designer to select an optimum compromise between capacitance on the one hand and transit time and scattering on the other hand so as to obtain high switching speeds.

The separating layer or layer system doped to generate majority charge carriers is asymmetrically doped.

This asymmetric doping ensures that the two-dimensional electron or hole gas is created in the control electrode and not at the extraction electrode. The 2DEG is in fact generated at temperatures between about 100° K. and 300° K. and this results in a quantum well between the control electrode and the asymmetrically doped separator layer or system with majority carriers being locked into this potential well. However, room temperature and temperatures considerably below zero would also be sufficient to generate the 2DEG.

One way of achieving the required asymmetric doping is the provision of at least one monoatomic dopant layer in the separating layer or layer system. If the semiconductor device is fabricated in $GaAs/Al_xGa_{1-x}As$ then the monoatomic layer, which would typically consist of silicon, is located in a narrow layer of GaAs to reduce the danger of silicon diffusion.

A hot electron transistor in accordance with the present invention is formed by a sequence of epitaxially grown layers and is characterised in that it comprises first, second an third electrode layers of the same composition, with said electrode layers being contacted to form a majority carrier extraction electrode (collector), said control electrode (base) and a majority carrier injection electrode (emitter) respectively; in that said separating layer or layer system adjacent said control electrode and doped to form a two-dimensional electron gas confined in a potential well at the interface between said control electrode and said doped separating layer or layer system is disposed between said control electrode and said majority carrier extraction electrode and is of different composition from these electrodes; in that a further separating layer or layer system is provided between said majority carrier injection electrode and said control electrode, is of a composition different from these electrodes, forms a potential barrier for majority carriers injected at said majority carrier injection electrode and is sufficiently thin to permit tunnelling of said injected majority carriers through said potential barrier; and in that said first and third electrode layers are doped to conduct said majority carriers.

If the structure is based on GaAs/Al$_x$Ga$_{1-x}$As it is typically characterised in that said first electrode layer forming said collector comprises n+GaAs having a dopant density of $1\times10^{18}$cm$^3$ and of arbitrary thickness; in that said doped separating layer or layer system is grown on said first layer and comprises Al$_x$Ga$_{1-x}$As, with x lying in the range of 0.1 to 0.4 and preferably being 0.35, and has a thickness of 30 to 80 nm; in that said second electrode layer forming said control electrode comprises intrinsic GaAs and has a thickness in the range 10 to 100 nm; in that the further separating layer or layer system grown on said layer forming said control electrode comprises at least one layer having the composition Al$_x$Ga$_{1-x}$As, with x lying in the range 0.1 to 0.4 and preferably being 0.35, and a thickness in the range 10 to 15 nm; and in that said third electrode layer is n+GaAs having a dopant density of $1\times10^{18}$cm$^3$ and an arbitrary thickness.

The monoatomic layer is preferably a monoatomic layer in which not all atomic sites are occupied, has a doping concentration of $5\times10^{12}$cm$^{-2}$, preferably of silicon atoms, and is located in a layer of intrinsic gallium arsenide of substantially 1 nm thickness, with said layer of intrinsic GaAs in which said monoatomic layer is located being spaced from said control electrode by an Al$_x$Ga$_{1-x}$As spacer layer having a thickness of approximately 2.5 nm.

The further separating layer or layer system preceding the control electrode in the direction of majority carrier flow is typically of a thickness in the range 2 nm to 50 nm and is optionally doped. In this respect the hot electron transistor of the invention corresponds to the known hot electron transistor so that its behaviour in this region is well understood.

In a preferred embodiment having a majority carrier injection electrode the majority carrier injection electrode is preferably separated from the control electrode by a layer system comprising at least two layers of different composition with said layers being substantially doped.

In a particularly preferred version of this embodiment a two-dimensional electron (or hole) gas (2DEG) is formed in a potential well at the interface between the two layers of different compositions. This provides a high density of charge carriers at the interface between the two layers and the tunnelling mechanism results in a narrow energy distribution of the majority carriers injected into the control electrode. This narrow energy distribution results in rapid rise times and thus fast switching. In this case the 2DEG only arises when a bias voltage is applied between the emitter and the base which is advantageous since it improves the switching characteristic of the device.

In another preferred version of this embodiment in which the majority carrier injection electrode (emitter) is separated from the control electrode (base) by a layer system comprising at least two layers of different composition. The layers are laid out so that resonant tunnelling injection can be used, which is important in bistable devices.

Embodiments of the invention will now be described in more detail in the following by way of example only, and with reference to the accompanying drawings which show:

FIG. 1 a schematic cross-section through a hot electron transistor showing the layout of the various layers, FIG. 2 a schematic view of the conduction band of the transistor of FIG. 1 without applied bias, FIG. 3 a schematic view of the conduction band of the transistor of FIG. 1 with applied bias, FIG. 4 a schematic view (without applied bias) of the conduction band of a modified embodiment in which the asymmetric doping of the separating layer adjacent the control electrode is achieved in a different manner, FIG. 5 a view of the conduction band of a further variant of the hot electron transistor of FIG. 1 (with applied bias) in which the separating layer system between the majority carrier injection electrode and the control electrode comprises two layers of different compositions.

Figure 1:
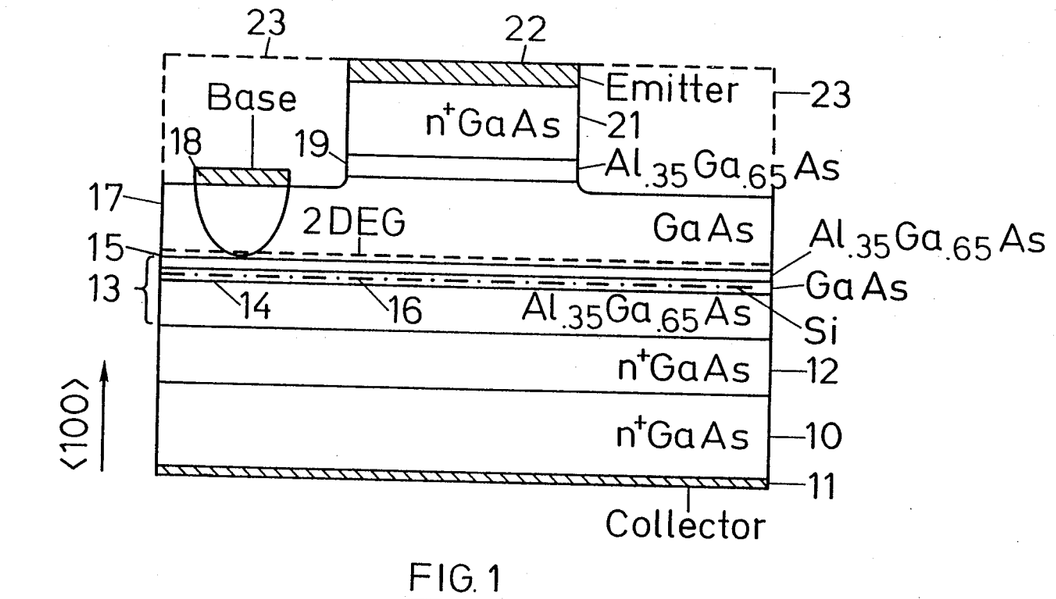

Turning now to FIG. 1 there can be seen a schematic cross-section through a hot electron transistor fabricated in GaAs/Al$_{x'Ga1-x}$As and grown by molecular beam epitaxy on a GaAs substrate with growth of the layers taking place in the <100> direction.

For fabrication of this transistor an n+GaAs substrate 10 is first mounted on a holder (not shown) via metallic indium. The indium in fact forms a good ohmic contact to the gallium arsenide structure and can, if desired, be retained as the collector contact 11 as shown in FIG. 1.

In the usual way a further layer 12 of n+GaAs is then grown on the substrate 10 and it is this layer 12 which strictly speaking is to be regarded as the collector electrode. The reason for growing this further layer 12 on the substrate 10 is to ensure a regular crystallographic structure. The thickness of the substrate 10 is typically 100 μ and the thickness of the further layer 12 is generally selected to be in the range 0.1 to 1 μ, the precise thickness is however not critical.

A separating layer system of different composition and of total thickness in the range of 30 to 80 nm is then grown on top of the layer 12. The composition of this layer system 13 is Al$_{0.35}$Ga$_{0.65}$As and includes a narrow layer 14 of intrinsic gallium arsenide which is of 1 nm thickness and is separated from the upper surface of the layer system 13 by a spacer of Al$_{0.35}$Ga$_{0.65}$As which is also very thin, typically of 2.5 nm thickness. In the middle of the intrinsic GaAs layer 14 there is located a monoatomic doping layer 16 of silicon with a surface doping concentration of $5\times10^{12}$cm$^{-2}$, i.e. not all atomic sites are occupied by silicon atoms. The narrow GaAs layer 14 is necessary to prevent diffusion of the silicon atoms within the Al$_{0.35}$Ga$_{0.65}$As material surrounding the layer 14.

A further layer of intrinsic gallium arsenide is then grown on the separating layer system 13 and, as will later be explained with references to FIGS. 2 and 3, the presence of the monoatomic layer 16 results in the formation of a two-dimensional electron gas (2DEG) which is confined in a quantum well formed at the interface between the intrinsic GaAs layer 17 and the separating layer system 13. The layer 27 is in fact the control electrode of the device and is provided with contact 18 in the form of a low resistance ohmic contact which extends into the two-dimensional electron gas. The total thickness of the intrinsic gallium arsenide layer 17 can be selected to lie between 10 and 100 nm and this provides the designer with a substantial degree of freedom in optimising the characteristics of the device.

A further separating layer 19 of $Al_{0.35}Ga_{0.65}As$ of 10 to 15 nm thickness is then grown on top of the intrinsic GaAs layer 17. This further separating layer 19 is then followed by a thicker layer 21 of n+GaAs which is finally contacted in the usual manner to form an emitter electrode. The contact is schematically illustrated at 22. The doping concentration of the n+GaAs emitter electrode and of the n+GaAs collector electrode is typically of the order of $1\times 10^{18}cm^{-3}$. The thickness of the layer 21 is non-critical but typically about 0.5 $\mu$. In growing the structure the individual layers would normally be grown so that the structure has the shape illustrated by the broken lines 23 in FIG. 1 and the top ring of material, illustrated by the left and right hand corners of the sectional drawing would then be etched away to allow application of the control electrode contact 18. Naturally the structure would then be provided with the usual oxide layers or surface treatments to prevent surface leakage etc.

Figure 2:
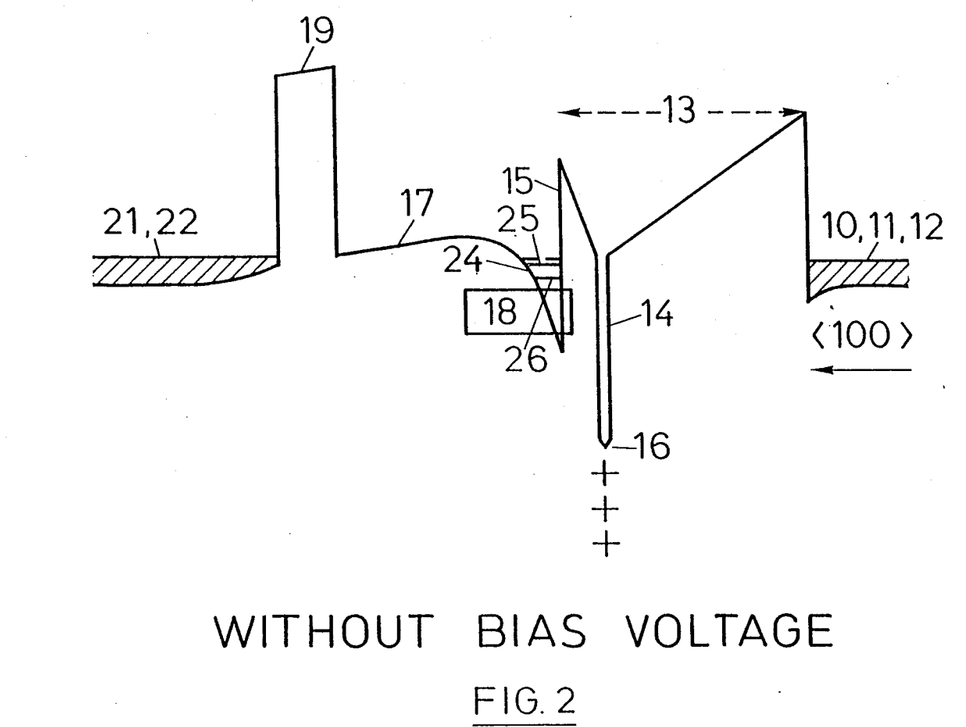

A band scheme illustrating the conduction band of the hot electron transistor of FIG. 1 can be seen in FIG. 2 and the numerals used in FIG. 1 have been inserted to assist in identifying the individual regions of the band scheme. The valence band has not been illustrated, it will however be readily understood that this band is of complementary shape. The band scheme of FIG. 2 illustrates the situation without applied bias. Even in this state space charge electrons have gathered at the interface between the control electrode 17 and the spacer system 13 and have formed a pronounced quantum well 24. These space charge electrons are trapped in this quantum well, normally in two distinct levels illustrated by 25 and 26. These electrons are the electrons of the 2DEG and the band scheme of FIG. 2 schematically illustrates how these are contacted by the ohmic contact 18. It is the presence of this 2DEG which allows the bias voltage to be applied to the control electrode layer 17 without the need for high doping concentrations.

As previously mentioned it is the absence of the dopant which reduces both plasmon/phonon coupling and scattering in the base region which leads to high gain and fast switching speeds.

Figure 3:
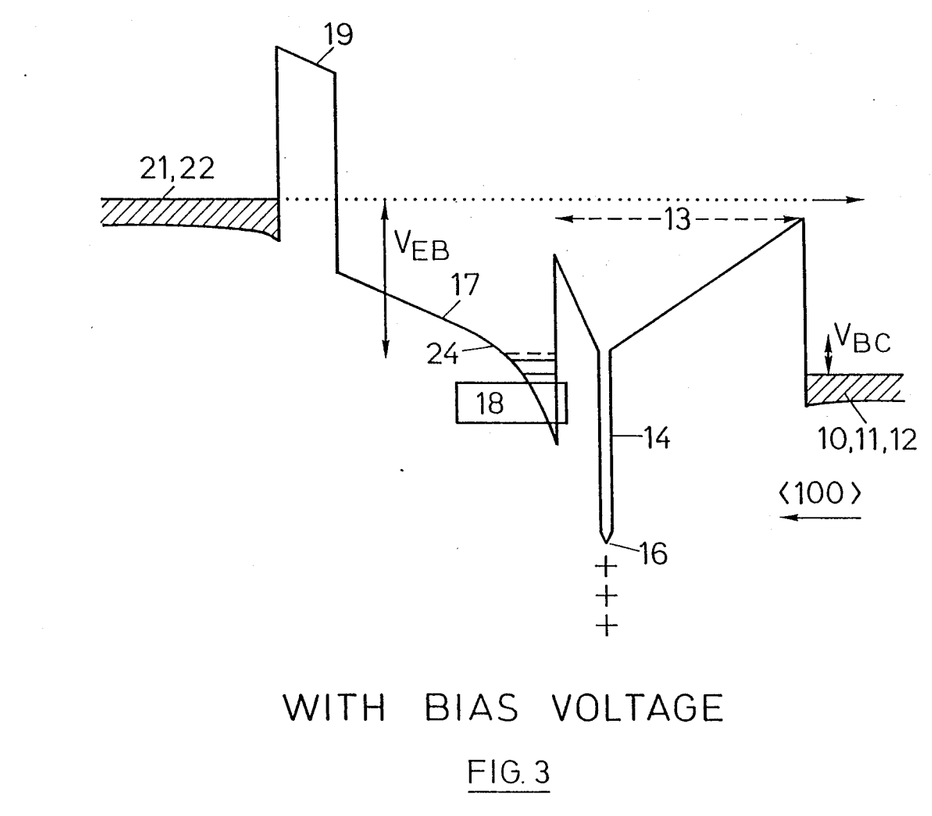

FIG. 3 illustrates the way an applied voltage modifies the band scheme of FIG. 2. The following points are worthy of special mention:

(a) the electrons injected from the emitter how have sufficient energy to clear the top of the potential barrier between base and collector, (b) electrons are collected at the collector with a small voltage bias $V_{bc}$.

Figure 4:
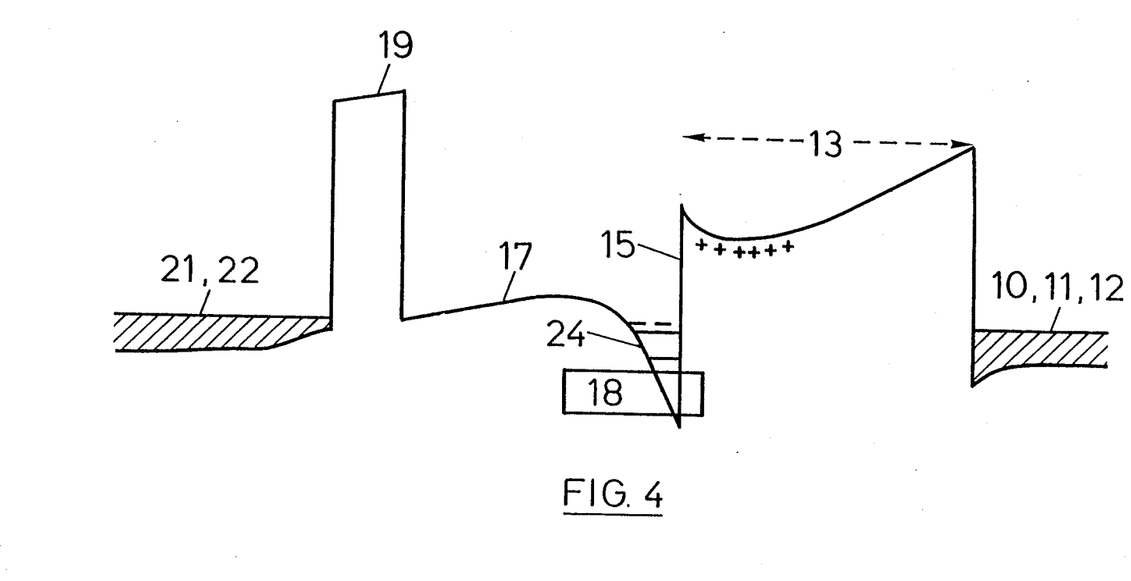

Turning now to FIG. 4 an alternative embodiment is shown in which the 2DEG is generated simply by asymmetric doping of the layer 13. In this case the doping concentration of the layer 13 as it is grown on top of the layer 12. It will be noted that the asymmetric doping leads to a trough in the conduction band edge which is closer to the control electrode 17 than the collector electrode 12. This results in the formation of a 2DEG at the interface between the layer 17 and the layer 13 in correspondence with the band scheme of FIG. 2. This asymmetric doping is achieved by varying the doping profile from layer 12 to layer 17 in accordance with the following scheme:

a thick undoped layer of $Al_{0.35}Ga_{0.65}As$, 30 to 80 nm thick is grown on top of n+GaAs layer 12. Then a doped $Al_{0.35}Ga_{0.65}As$ layer, 20 to 50 nm thick doped with density $1\times 10^{18}cm^{-3}$ is grown on top of the undoped layer. Then a further undoped layer of $Al_{0.35}Ga_{0.65}As$ of 2 to 20 nm thickness is grown on top of the doped layer.

Figure 5:
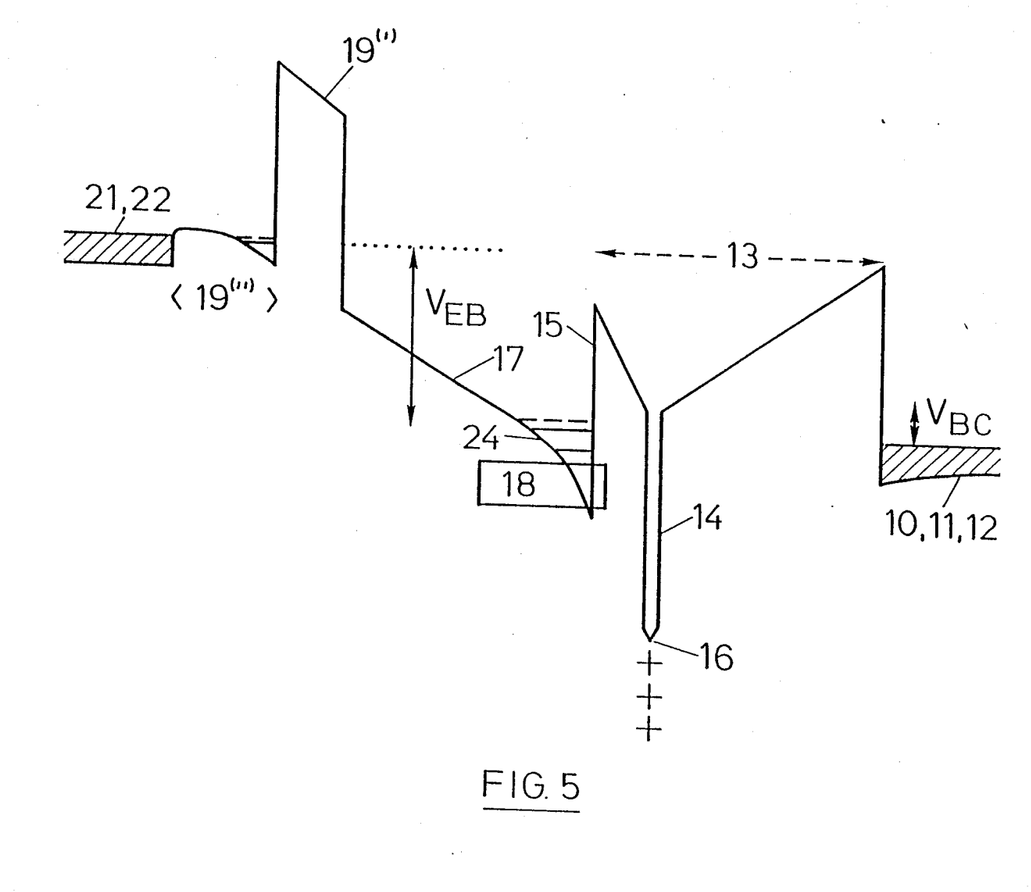

Finally, FIG. 5 shows the conduction band scheme for a development of the invention in which the separating layer between the emitter and the base is a layer system comprising at least two layers of different compositions. Thus the layer 19 may be thought of as being constituted by two layers 19', 19" with the layer 19' having the composition $Al_{0.35}Ga_{0.65}As$ and with the layer 19" having the composition GaAs and being substantially undoped. This arrangement leads (with applied bias as shown in FIG. 5) to a two-dimensional electron gas being trapped in a quantum well at the interface between the two layers 19", 19' and this is very favourable for the switching action of the hot electron transistor. The presence of the electrons at this interface means that the energy distributions of electrons tunnelling through the potential barrier caused by the layer 19' will be a very sharp distribution which ensures rapid rise times and high gain of the transistor.

We claim:

1. A semiconductor device having a plurality of semiconductor layers of different composition, such as a hot electron transistor, some of which are contacted to form electrodes, with at least one of said layers acting as a control electrode, wherein the control electrode is separated from each of the other electrodes by a respective separating layer or layer system of different composition from the composition of the layer forming the control electrode, whereby said separating layers or layer system form potential barriers for the majority carriers, characterised in that the layer acting as said control electrode is substantially undoped; in that one of the separating layer or layer systems adjacent the control electrode is doped to generate majority charge carriers which form a two-dimensional electron or hole gas confined in a potential well at the interface between the control electrode and the doped separating layer or layer system; and in that the contact to the control electrode is a contact to the two-dimensional electron or hole gas.

2. A semiconductor device in accordance with claim 1, characterised in that the contact to the control electrode is a low resistance ohmic contact.

3. A semiconductor device in accordance with claim 1, characterised in that the layer forming the control electrode is of thickness in the range 10 nm to 100 nm.

4. A semiconductor device in accordance with claim 1, wherein said separating layer or layer system doped to generate said majority charge carriers which form said two-dimensional electron or hole gas is asymmetrically doped.

5. A semiconductor device in accordance with claim 4, characterised in that the doping of said asymmetrically doped separating layer or layer system adjacent said control electrode comprises at least one monoatomic dopant layer.

6. A semiconductor device in accordance with claim 1 in the form of a hot electron transistor, characterised in that said hot electron transistor is formed by a sequence of expitaxially grown layers and comprises first, second and third electrode layers of the same composition, with said electrode layers being contacted to form a majority carrier extraction electrode (collector), said control electrode (base) and a majority carrier injection electrode (emitter) respectively; in that said separating layer or layer system adjacent said control electrode and doped to form a two-dimensional electron gas confined in a potential well at the interface between said control electrode and said doped separating layer or layer system is disposed between said control electrode and said majority carrier extraction electrode and is of different composition from these electrodes; in that a further separating layer or layer system is provided between said majority carrier injection electrode and said control electrode, is of a composition different from these electrodes, forms a potential barrier for majority carriers injected at said majority carrier injection electrode and is sufficiently thin to permit tunnelling of said injected majority carriers through said potential barrier; and in that said first and third electrode layers are doped to conduct said majority carriers.

7. A hot electron transistor in accordance with claim 6 fabricated in GaAs/Al$_x$Ga$_{1xx}$As, characterised in that said first electrode layer forming said collector comprises n$^+$GaAs having a dopant density of $1 \times 10^{18}$cm$^3$ and of arbitrary thickness; in that said doped separating layer or layer system is grown on said first layer and comprises Al$_x$Ga$_{1-x}$As, with x lying in the range 0.1 to 0.4 and preferably being 0.35, and has a thickness of 30 to 80 nm; in that said second electrode layer forming said control electrode comprises intrinsic GaAs and has a thickness in the range 10 to 100 nm; in that the further separating layer or layer system grown on said layer forming said control electrode comprises at least one layer having the composition Al$_x$Ga$_{1-x}$As, with x lying in the range 0.1 to 0.4 and preferably being 0.35, and a thickness in the range 10 to 15 nm; and in that said third electrode layer is n$^+$GaAs having a dopant density of $1 \times 10^{18}$cm$^3$ and of arbitrary thickness.

8. A semiconductor device in accordance with claim 7 characterised in that said doped separating layer of layer system of Al$_x$Ga$_{1-x}$As grown on said first electrode layer includes at least one monoatomic dopant layer located in a narrow layer of GaAs asymmetrically positioned in said Al$_x$Ga$_{1-x}$As separating layer adjacent said control electrode.

9. A lot electron transistor in accordance with claim 8, characterised in that the monoatomic layer is a monoatomic layer in which not all atomic sites are occupied, has a doping concentration of $5 \times 10^{12}$cm$^{-2}$, preferably of silicon atoms, and is located in a layer of intrinsic gallium arsenide of substantially 1 nm thickness, with said layer of intrinsic GaAs in which said monoatomic layer is located being spaced from said control electrode by an Al$_x$Ga$_{1-x}$As spacer layer having a thickness of approximately 2.5 nm.

10. A semiconductor device in accordance with claim 1, characterised in that the further separating layer or layer system preceding the control electrode in the direction of majority current flow is of thickness in the range 2 nm to 50 nm, and is optionally doped.

11. A semiconductor device in accordance with claim 1 and having a majority carrier injection electrode, characterised in that the majority carrier injection electrode is separated from said control electrode by a layer system comprising at least two layers of different compositions with said two layers of different compositions being substantially undoped.

12. A semiconductor device in accordance with claim 11, characterised in that a two-dimensional electrol or hole gas is formed in a potential well at the interface between said two layers of different compositions, on application of a bias voltage between said majority carrier injection electrode and said control electrode.

13. A hot electron transistor comprising a plurality of epitaxially grown semiconductor layers of materials of different compositions, said layers including, in sequence;

a layer of a material of a first composition serving as a collector layer, separating layer means, of a material of a different composition from said collector layer, a layer of undoped material of said first composition serving as a base layer, a further separating layer means of a different composition from said collector and base layers, and a further base of material of said first composition serving as an emitter, there being respective collector, base and emitter contacts to said collector, base and emitter layers respectively, wherein said separating layer means is disposed between said collector layer and said base layer and comprises a monoatomic layer of dopant material with first and second layers of separating layer material on respective sides thereof, wherein not all atomic sites of the monoatomic dopant layer are occupied by doping atoms, and wherein the first layer of separating material disposed between said base layer and said monoatomic layer is substantially thinner than said second layer of separating material disposed between said monoatomic layer and said collector layer.

14. A semiconductor device in accordance with claim 13, wherein the contact to the base layer is a low resistance ohmic contact.

15. A semiconductor device used in accordance with claim 13, wherein the base layer is of thickness in the range of 10 nm to 100 nm.

16. A hot electron transistor in accordance with claim 13 wherein said collector layer comprises n+GaAs having a dopant density of $1 \times 10^{18}$cm$^3$ and of arbitrary thickness; wherein said separating layer means is grown on said collector layer and comprises Al$_x$Ga$_{1-x}$As, with x lying in the range of 0.1 to 0.4 and preferably being 0.35, and has a thickness of 30 to 80 nm; in that said base layer comprises intrinsic GaAs and has a thickness in the range 10 to 100 nm; wherein the separating layer means is grown on said collector layer and comprises at least one layer having the composition Al$_x$Ga$_{1-x}$As, with x lying in the range of 0.1 to 0.4 and preferably being 0.35, and a thickness in the range 10 to 15 nm; and wherein said third electrode layer is n+GaAs having a dopant density of $1 \times 10^{18}$cm$^3$ and an arbitrary thickness.

17. A semiconductor device in accordance with claim 16 wherein said separating layer means includes at least one monoatomic dopant layer located in a narrow layer of GaAs asymmetrically positioned in said Al$_x$Ga$_{1-x}$As separating layer adjacent said collector layer.

18. A hot electron transistor in accordance with claim 17, wherein the monoatomic layer is a monoatomic layer in which not all atomic sites are occupied, has a doping concentration of $5-10^{12}$cm$^{-2}$, preferably of silicon atoms, and is located in a layer of intrinsic gallium arsenide of substantially 1 nm thickness, with said layer of intrinsic GaAs in which said monoatomic layer is located being spaced from said collector layer by an Al$_x$Ga$_{1-x}$As spacer layer having a thickness of approximately 2.5 nm.

19. A hot electron transistor comprising a plurality of epitaxially grown semiconductor layers of materials of different compositions, said layers including, in sequence;

a layer of a material of a first composition serving as a collector layer, separating layer means, of a material of a different composition from said collector layer, a layer of undoped material of said first composition serving as a base layer, a further separating layer means of a different composition from said collector and base layers, and a further layer of material of said first composition serving as an emitter, there being respective collector, base and emitter contacts to said collector, base and emitter layers respectively, wherein said further separating layer means between said base layer and said emitter layer comprises a layer system having at least two layers of different compositions, adjoining each other at an interface with one of said layers being adjacent said base layer, said two layers being substantially undoped, wherein a two-dimensional charge carrier gas is formed in a potential well at said interface on application of a bias voltage between said emitter contact and said base contact, and wherein said one of said two layers adjacent said base layer is sufficiently thin to permit tunneling of charge carriers from said charge carrier gas therethrough.

20. A semiconductor device in accordance with claim 19, wherein the contact to the base layer is a low resistance ohmic contact.

21. A semiconductor device in accordance with claim 19, wherein the base layer is of thickness in the range 10 nm to 100 nm.

22. A hot electron transistor in accordance with claim 19 wherein said collector layer comprises n+GaAs having a dopant density of $1 \times 10^{18} cm^3$ and of arbitrary thickness; wherein said separating layer means is grown on said collector layer and comprises $Al_xGa_{1-x}As$, with x lying in the range 0.1 to 0.4 and preferably being 0.35, and has a thickness of 30 to 80 nm; in that said base layer comprises intrinsic GaAs and has a thickness in the range 10 to 100 nm; wherein the separating layer means is grown on said collector layer and comprises at least one layer having the composition $Al_xGa_{1-x}As$, with x lying in the range 0.1 to 0.4 and preferably being 0.35, and a thickness in the range 10 to 15 nm; and wherein said third electrode layer is in n+GaAs having a dopant density of $1 \times 10^{18} cm^3$ and an arbitrary thickness.

23. A semiconductor device in accordance with claim 22, wherein said separating layer means includes at least one monoatomic dopant layer located in a narrow layer of GaAs asymmetrically positioned in said $Al_xGa_{1-x}As$ separating layer adjacent said collector layer.

24. A hot electron transistor in accordance with claim 23, wherein the monoatomic layer is a monoatomic layer in which not all atomic sites are occupied, has a doping concentration of $5 \times 10^{12} cm^{-2}$, preferably of silicon atoms, and is located in a layer of intrinsic gallium arsenide of substantially 1 nm thickness, with said layer of intrinsic GaAs in which said monoatomic layer is located being spaced from said collector layer by an $Al_xGa_{1-x}As$ spacer layer having a thickness of approximately 2.5 nm.

25. A hot electron transistor comprising a plurality of epitaxially grown semiconductor layers of materials of different compositions, said layers including, in sequence;

a layer of a material of a first composition serving as a collector layer, separating layer means, of a material of a different composition from said collector layer, a layer of undoped material of said first composition serving as a base layer, a further separating layer means of a different composition from said collector and base layers, and a further layer of material of said first composition serving as an emitter, there being respective collector, base and emitter contacts to said collector, base and emitter layers respectively, said separating layer means between said collector layer and said base layer comprising a monoatomic layer of dopant material with first and second layers of separating layer material on respective sides thereof, wherein not all atomic sites of the monoatomic dopant layer are occupied by doping atoms, and wherein the first layer of separating material disposed between said base layer and said monoatomic layer is substantially thinner than said second layer of separating material disposed between said monoatomic layer and said collector layer, said further separating layer means comprising a layer system having at least two layers of different compositions adjoining each other at an interface with one of said layers being adjacent said base layer, said two layers being substantially undoped, wherein a two-dimensional charge carrier gas is formed in a potential well at said interface on application of a bias voltage between said emitter electrode and said base electrode, and wherein said one of said two layers adjacent said base layer is sufficiently thin to permit tunneling of charge carriers from said charge carrier gas therethrough.

26. A semiconductor device in accordance with claim 25, wherein the contact to the base layer is a low resistance ohmic contact.

27. A semiconductor device in accordance with claim 25, wherein the base layer of thickness in the range 10 nm to 100 nm.

28. A hot electron transistor in accordance with claim 25 wherein said collector layer comprises n+GaAs having a dopant density of $1 \times 10^{18} cm^3$ and of arbitrary thickness; wherein said separating layer means is grown on said collector layer and comprises $Al_xGa_{1-x}As$, with x lying in the range 0.1 to 0.4 and preferably being 0.35, and has a thickness of 30 to 80 nm; in that said base layer comprises intrinsic GaAs and has a thickness in the range 10 to 100 nm; wherein the separating layer means is grown on said collector layer and comprises at least one layer having the composition $Al_xGa_{1-x}As$, with x lying in the range 0.1 to 0.4 and preferably being 0.35, and a thickness in the range 10 to 15 nm; and wherein said third electrode is in n+GaAs having a dopant density of $1 \times 10^{18} cm^3$ and an arbitrary thickness.

29. A semiconductor device in accordance with claim 28 wherein said separating layer means includes at least one monoatomic dopant layer located in a narrow layer of GaAs asymmetrically positioned in said $Al_xGa_{1-x}As$ separating layer adjacent said collector layer.

30. A hot electron transistor in accordance with claim 29, wherein the monoatomic layer is a monoatomic layer in which not all atomic sites are occupied, has a doping concentration of $5 \times 10^{12} cm^{-2}$, preferably of silicon atoms, and is located in a layer of intrinsic gallium arsenide of substantially 1 nm thickness, with said layer of intrinsic GaAs in which said monoatomic layer is located being spaced from said collector layer by an $Al_x1-xAs$ spacer layer having a thickness of approximately 2.5 nm.

32. An epitaxially grown compositional semiconductor device comprising a majority carrier injection electrode, a control electrode, and a majority carrier extraction electrode, with said majority carrier injection electrode providing contact to a majority carrier injection layer of semiconductor material, and with said control electrode providing contact to a control layer of semiconductor material, said majority carrier injection layer being separated from said control layer by a separating layer system comprising a layer system having at least two layers of different compositions, adjoining each other at an interface with one of said layers being adjacent said base layer, said two layers being substantially undoped, wherein a two-dimensional charge carrier gas is formed in a potential well at said interface on application of a bias voltage between said emitter electrode and said base electrode, and wherein said one of said two layers adjacent said base layer is sufficiently thin to permit tunneling of charge carriers from said charge carrier gas therethrough.

* * * * *

UNITED STATES PATENT AND TRADEMARK OFFICE
CERTIFICATE OF CORRECTION

PATENT NO. : 4,878,095

DATED : October 31, 1989

INVENTOR(S) : SIMON J. BENDING, et al.

It is certified that error appears in the above-identified patent and that said Letters Patent is hereby corrected as shown below:

Column 1, line 15, after "article" insert --entitled--.
Column 2, line 38, delete the periods after "100° K" and "300° K".
Column 2, line 55, delete "an" and insert --and--.
Column 3, line 48, delete "doped" and insert --undoped--.
Column 4, line 23, delete "GaAs/Al$_X$'$_{Ga1-X}$As" and insert --GaAs/Al$_x$Ga$_{1-x}$As--.
Column 4, line 63, delete "27" and insert --17--.
Column 5, line 12, insert a period after "$\mu$".
Column 5, line 49, delete "how" and insert --now--.

Signed and Sealed this

Twenty-seventh Day of August, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,878,095

DATED : October 31, 1989

INVENTOR(S) : Simon J. Bending, et al

It is certified that error appears in the above-identified patent and that said Letters Patent is hereby corrected as shown below:

Column 7, line 19    delete "$GaAs/Al_xGa_{1xx}As$" and insert --$GaAs/Al_xGa_{1-x}As$--.

Column 7, line 35    delete "of" (second occurrence) and insert --an--.

Column 7, line 37    delete "of" and insert --or--.

Column 7, line 43    delete "lot" and insert --hot--.

Column 7, line 66    delete "electrol" and insert --electron--.

Column 8, line 15    delete "base" and insert --layer--.

Column 8, line 38    delete "n+GaAs" and insert --n+ GaAs--.

Column 8, line 62    delete "$5-10^{12}cm^{-2}$" and insert --$5\times10^{12}cm^{-2}$--.

Column 9, line 37    delete "n+GaAs" and insert --n+ GaAs--.

Column 10, line 42   insert --is-- after "layer".

Column 10, line 45   delete "n+GaAs" and insert --n+ GaAs--.

Column 11, line 5    delete "$Al_x1-xAs$" and insert --$Al_xGa_{1-x}As$--.

UNITED STATES PATENT AND TRADEMARK OFFICE
CERTIFICATE OF CORRECTION

PATENT NO. : 4,878,095
DATED : October 31, 1989
INVENTOR(S) : SIMON J. BENDING, et al.

It is certified that error appears in the above-identified patent and that said Letters Patent is hereby corrected as shown below:

ON TITLE PAGE:

Item [73] the name of the assignee should read,

--Max-Planck-Gesellschaft zur Förderung der

Wissenschaften e.V.--

Signed and Sealed this

Third Day of December, 1991

Attest:

HARRY F. MANBECK, JR.

*Attesting Officer*      *Commissioner of Patents and Trademarks*